United States Patent

Morgott

(10) Patent No.: US 10,037,979 B2
(45) Date of Patent: Jul. 31, 2018

(54) SURFACE-MOUNTABLE MULTI-CHIP COMPONENT

(71) Applicant: OSRAM Opto Semiconductors GmbH, Regensburg (DE)

(72) Inventor: Stefan Morgott, Pentling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/111,775

(22) PCT Filed: Jan. 30, 2015

(86) PCT No.: PCT/EP2015/051955
§ 371 (c)(1),
(2) Date: Jul. 14, 2016

(87) PCT Pub. No.: WO2015/114103
PCT Pub. Date: Aug. 6, 2015

(65) Prior Publication Data
US 2016/0336301 A1 Nov. 17, 2016

(30) Foreign Application Priority Data

Jan. 31, 2014 (DE) .................. 10 2014 101 215

(51) Int. Cl.
*H01L 25/075* (2006.01)
*H01L 33/48* (2010.01)
(Continued)

(52) U.S. Cl.
CPC ...... *H01L 25/0753* (2013.01); *H01L 23/3107* (2013.01); *H01L 23/49562* (2013.01);
(Continued)

(58) Field of Classification Search
None
See application file for complete search history.

(56) References Cited

U.S. PATENT DOCUMENTS 7,183,588 B2  2/2007  Chia et al.
8,168,453 B2  5/2012  Han et al.
(Continued)

FOREIGN PATENT DOCUMENTS

DE  102011085645 A1  5/2013
JP      01157577 A  *  6/1989  ......... H01L 25/0753
(Continued)

OTHER PUBLICATIONS

OSRAM Opto Semiconductors GmbH, "OSRAM OSTAR Projection Compact," Datasheet, LE BA Q6WM, Version 3.1, Apr. 23, 2014, 18 pages.
(Continued)

*Primary Examiner* — Fazli Erdem
*Assistant Examiner* — Scott R Wilson
(74) *Attorney, Agent, or Firm* — Slater Matsil, LLP

(57) ABSTRACT

A surface-mountable multi-chip component includes a carrier having a first connection element, a second connection element and third connection element that are electrically insulated from one another. A first semiconductor chip is arranged on the first connection element and electrically connected to the first and second connection elements. The first connection element forms a first electrode and the second connection element forms a second electrode for the first semiconductor chip. A second semiconductor chip is arranged on the second connection element and electrically connected to the second and third connection elements. The third connection element forms a first electrode and the second connection element forms a second electrode for the second semiconductor chip. The second connection element forms a common cathode or anode for the first and second semiconductor chips during operation.

17 Claims, 3 Drawing Sheets

(51) Int. Cl.
  *H01L 33/62* (2010.01)
  *H01L 23/31* (2006.01)
  *H01L 23/495* (2006.01)

(52) U.S. Cl.
  CPC ...... *H01L 23/49575* (2013.01); *H01L 33/486* (2013.01); *H01L 33/62* (2013.01); *H01L 2224/48247* (2013.01); *H01L 2924/0002* (2013.01)

(56) References Cited

U.S. PATENT DOCUMENTS

| | | | |
|---|---|---|---|
| 2007/0194333 A1* | 8/2007 | Son | H01L 25/0753 257/88 |
| 2009/0001490 A1 | 1/2009 | Bogner et al. | |
| 2010/0244731 A1 | 9/2010 | Kaihotsu et al. | |
| 2010/0259930 A1* | 10/2010 | Yan | F21K 9/00 362/235 |
| 2010/0320928 A1* | 12/2010 | Kaihotsu | H01L 25/0753 315/250 |
| 2011/0248289 A1 | 10/2011 | Hsieh et al. | |
| 2012/0086024 A1* | 4/2012 | Andrews | H01L 25/0753 257/88 |
| 2012/0194059 A1 | 8/2012 | Liu | |
| 2014/0285088 A1 | 9/2014 | Windisch | |

FOREIGN PATENT DOCUMENTS

| | | |
|---|---|---|
| JP | 1157577 A | 6/1989 |
| JP | 6196759 A | 7/1994 |
| JP | 2007288198 A | 11/2007 |

OTHER PUBLICATIONS

OSRAM Opto Semiconductors GmbH, "OSLON Black Flat," Datasheet, KW H2L531.TE, Version 1.3, Jun. 17, 2015, 22 pages.

* cited by examiner

SURFACE-MOUNTABLE MULTI-CHIP COMPONENT

This patent application is a national phase filing under section 371 of PCT/EP2015/051955, filed Jan. 30, 2015, which claims the priority of German patent application 10 2014 101 215.1, filed Jan. 31, 2014, each of which is incorporated herein by reference in its entirety.

TECHNICAL FIELD

A surface-mountable multi-chip component is specified which is preferably provided for emitting radiation. In particular, the multi-chip component is a multicolored light emitting diode module.

BACKGROUND

Projection or spotlight/headlight applications require light sources which firstly produce high light powers and secondly have a compact construction. A compact construction includes, inter alia, a simple electrical supply of the light source in order to minimize the number of further electrical components such as drivers, for example. Light sources are known, for example, which have a plurality of semiconductor chips which are arranged in the same orientation on a common metallization forming a common electrode and are drivable separately. In the case where the semiconductor chips have different orientations, however, separate driving is more difficult to realize. In the present case, the orientation should be understood to mean, in particular, the arrangement of the semiconductor chips with regard to their pn junctions.

SUMMARY OF THE INVENTION

Embodiments of the invention specify a surface-mountable multi-chip component comprising separately drivable semiconductor chips having different orientations.

In accordance with at least one embodiment, the surface-mountable multi-chip component comprises a carrier having a first, second and third connection element, which are electrically insulated from one another. In particular, the connection elements have metallic properties. The connection elements can advantageously be produced from the same material and in particular from a single workpiece, for example a so-called leadframe. Preferably, the carrier is embodied in a planar fashion, that is to say that the carrier extends substantially in a single plane. It is thus possible, in particular, for the three connection elements to be arranged in the single plane.

In accordance with at least one embodiment, the surface-mountable multi-chip component comprises a first semiconductor chip and a second semiconductor chip. The surface-mountable multi-chip component can also have more than two semiconductor chips. Preferably, the first semiconductor chip is arranged on the first connection element. In particular, the first semiconductor chip is fixed to the first connection element by means of a fixing means, for example a solder or an adhesive. Furthermore, the first semiconductor chip is preferably electrically connected to the first and second connection elements. In this case, the first connection element can form a first electrode and the second connection element a second electrode for the first semiconductor chip.

With further preference, the second semiconductor chip is arranged on the second connection element. In particular, the second semiconductor chip is fixed to the second connection element by means of a fixing means, for example a solder or an adhesive. Furthermore, the second semiconductor chip is preferably electrically connected to the second and third connection elements. In this case, the third connection element can form a first electrode and the second connection element a second electrode for the second semiconductor chip.

In particular, the first electrode has a first polarity, while the second electrode has a second polarity different than the first.

In accordance with at least one embodiment, the second connection element forms a common cathode or anode for the first and second semiconductor chips during operation. By means of the common electrode and the separate further electrodes, it is possible during operation to drive the two semiconductor chips separately from one another.

In accordance with at least one embodiment, the first and second semiconductor chips in each case have a first semiconductor region of a first conductivity type and a second semiconductor region of a second conductivity type. By way of example, the first conductivity type can be a p-type conductivity and the second conductivity type can be an n-type conductivity.

Preferably, the two semiconductor chips are arranged in different orientations. In particular, the semiconductor regions of the semiconductor chips which adjoin the connection elements are of different conductivity types. This means, for example, that the first semiconductor chip is arranged such that the first semiconductor region, having a first conductivity type, adjoins the first connection element, while in the second semiconductor chip the second connection region, having a second conductivity type, adjoins the second connection element, and vice versa.

In one preferred configuration, the semiconductor regions of the same conductivity type of the two semiconductor chips are electrically connected to one another by means of the second connection element. That is to say that the semiconductor regions of the same conductivity type are connected to the same potential by means of the second connection element.

In accordance with at least one embodiment, the second connection element has a first and second partial region. The two partial regions are connected to one another in particular by a central region of the second connection element. In particular, the two partial regions can be electrically connected to one another exclusively by the central region. The central region can be a bonding wire, for example. The second connection element extends substantially along a diagonal connecting two corners of the carrier to one another. By way of example, the second semiconductor chip can be arranged on the first partial region. Furthermore, the second partial region can serve as a connection region for the first semiconductor chip. The first connection element can also have a first and second partial region. In particular, the first semiconductor chip is arranged on the first partial region of the first connection element.

In one preferred configuration of the surface-mountable multi-chip component, the carrier is composed of the connection elements in such a way that the first partial region of the first connection element and the first partial region of the second connection element are arranged alongside one another along a first main extension direction of the carrier. Furthermore, the second partial region of the first connection element and the second partial region of the second connection element can also be arranged alongside one another along the first main extension direction of the carrier. In particular, the two semiconductor chips are also arranged alongside one another among the first main extension direction.

Here and hereinafter, the fact that two or more partial regions are "arranged alongside one another" along a main extension direction can mean that the partial regions are arranged in a manner spatially separated from one another along the main extension direction. It is possible here, in particular, for the partial regions to overlap by at least 80%, preferably at least 90%, in terms of their maximum extent along a direction perpendicular to the main extension direction along which the partial regions are arranged alongside one another. In other words, it is possible for the partial regions to be arranged alongside one another along at least 80%, preferably at least 90%, of their maximum extent along the direction perpendicular to the main extension direction.

Furthermore, the carrier is advantageously composed of the connection elements in such a way that the third connection element and the second partial region of the second connection element are arranged alongside one another along the first main extension direction of the carrier.

Moreover, the carrier can be composed of the connection elements in such a way that the third connection element and the first partial region of the second connection element are arranged alongside one another along a second main extension direction of the carrier.

Preferably, the first partial region of the first connection element, the central region of the second connection element and also the third connection element are arranged along a diagonal arranged transversely with respect to the diagonal along which the second connection element extends.

In particular, the first partial region and the second partial region of the second connection element can be arranged along one diagonal connecting two corners of the carrier to one another. Furthermore, the first partial region of the first connection element and the third connection element can be arranged along the diagonal running transversely and/or perpendicularly with respect to the diagonal along which the partial regions of the second connection element are arranged.

In particular, the first and second main extension directions are arranged transversely, in particular perpendicularly, with respect to one another. Preferably, the first and second main extension directions span a plane parallel to which a front-side and rear-side main surface of the carrier are arranged.

By way of example, the carrier has a rectangle-like shape in a plan view of the plane spanned by the two main extension directions. In other words, the carrier has approximately the shape of a rectangle. The first main extension direction can then run along the first side of the rectangle, while the second main extension direction can run along the second side of the rectangle running transversely or perpendicularly with respect to the first side.

In particular, it is possible that the connection elements project neither above nor below one another in a vertical direction running perpendicularly to the two main extension directions, within the scope of the production tolerances. In other words, the connection elements can be arranged in a single plane. In addition, it is possible that the connection elements, and also the partial regions thereof, are in each case embodied in a planar fashion. Here and hereinafter, "embodied in a planar fashion" can mean that the connection elements have no macroscopic bulges and/or recesses along the two main extension directions. In particular, it is possible that each partial region or each connection element has in each case only two surfaces which extend along the main extension directions and are arranged parallel to one another in a vertical direction within the scope of the production tolerances.

Furthermore, the third connection element and the second partial region of the second connection element can have the same geometrical shape in a plan view of the carrier. Furthermore, the third connection element and the second partial region of the second connection element can have the same maximum extent along the first main extension direction and/or along the second main extension direction. Moreover, the first partial region of the first connection element and the first partial region of the second connection element can have a similar geometrical shape in plan view and in particular have a similar maximum extent along the two main extension directions. By way of example, the maximum extents of the two first partial regions along the two main extension directions differ by at most +/−10%.

In accordance with at least one embodiment, no semiconductor chip is arranged on the third connection element. In other words, the third connection element can be free of a semiconductor chip. In particular, the third connection element serves as a connection region for the second semiconductor chip. By way of example, the second semiconductor chip can be electrically connected to the third connection element by means of an electrical conductor. Correspondingly, the first semiconductor chip can be electrically connected to the second connection element by means of an electrical conductor. The electrical conductor is, in particular, a bonding wire extending from the semiconductor chip as far as the connection element to which an electrical connection is intended to be produced.

In accordance with at least one embodiment, the carrier has a main body, into which the connection elements are at least partly embedded. By way of example, for producing the carrier it is possible to use a leadframe which the three connection elements, wherein the connection elements are connected to one another. The leadframe can be at least partly embedded into a basic material. The leadframe composite assembly thus formed can be divided in such a way that the connection elements are separated from one another and are held together only by the main body composed of basic material. In particular, a plastics material such as an epoxy resin, for example, can be used as the basic material. Furthermore, the leadframe is preferably formed from copper or a copper-containing material.

Preferably, the component described here is a so-called QFN (Quad Flat No Leads) package. In particular, here the connection elements do not project laterally beyond the main body, but rather are integrated into the main body in a plane fashion. As a result, the required space on a connection carrier on which the multi-chip component can be mounted can be reduced and a higher packing density can be achieved. The connection carrier should be understood to be a printed circuit board, for example.

In one preferred configuration, the second connection element is partly covered by the main body at the rear-side main surface of the carrier. In particular, the central region described further above, which connects the first and second partial regions of the second connection element to one another, is covered by the main body. In particular, the multi-chip component thus has on the rear side of the carrier four connection regions, namely the first connection element, the first and second partial regions of the second connection element and the third connection element, such that the multi-chip component can be mechanically and electrically connected to the connection carrier at four locations. In particular, the four connection regions are arranged substantially symmetrically. As a result of the symmetrical arrangement of the four connection regions, the multi-chip component can be fixed mechanically stably on a connection carrier.

Advantageously, the carrier described here allows relatively small distances between the semiconductor chips, such that the multi-chip component has a compact size. In particular, the first and second semiconductor chips are separated from one another by an interspace having a lateral dimension of greater than zero and at most 0.1 mm. In particular, the lateral dimension of the interspace is determined along the first main extension direction of the carrier.

In accordance with at least one embodiment, the semiconductor chips are provided for emitting radiation. In particular, the semiconductor chips are thin-film chips which emit a large part of the generated radiation via their front-side surface during operation. Preferably, the semiconductor chips emit radiation in different wavelength ranges during operation. By way of example, one of the two semiconductor chips emits red light and the other blue light during operation.

In accordance with at least one embodiment, the first and second semiconductor chips in each case have a radiation-transmissive covering element arranged at the front-side surface of the semiconductor chips facing away from the respective connection element. The covering element has a uniform thickness, in particular. Furthermore, the covering element can be a glass element which is adhesively bonded on a front-side surface of a semiconductor layer sequence of the semiconductor chips. The glass element can lead to an improvement in the coupling out of radiation in the case of red light and to an attenuation in the case of blue light. The ratio of the in any case weaker red portion relative to the blue portion can be improved as a result.

In accordance with at least one embodiment, the multi-chip component has a housing frame, within which the semiconductor chips are arranged. Preferably, the housing frame is arranged on the carrier. By way of example, the housing frame can be a potting containing silicone. Furthermore, the housing frame can be embodied in a reflective fashion and contain, for example, additives of a reflective material such as titanium dioxide.

Furthermore, the semiconductor chips can have at their front-side surfaces a wavelength conversion element which converts at least part of the emitted radiation into radiation having a different wavelength.

BRIEF DESCRIPTION OF THE DRAWINGS

Further advantages, advantageous embodiments and developments will become apparent from the exemplary embodiments described below in association with the figures.

In the figures.

DETAILED DESCRIPTION OF ILLUSTRATIVE EMBODIMENTS

Figure 1A:
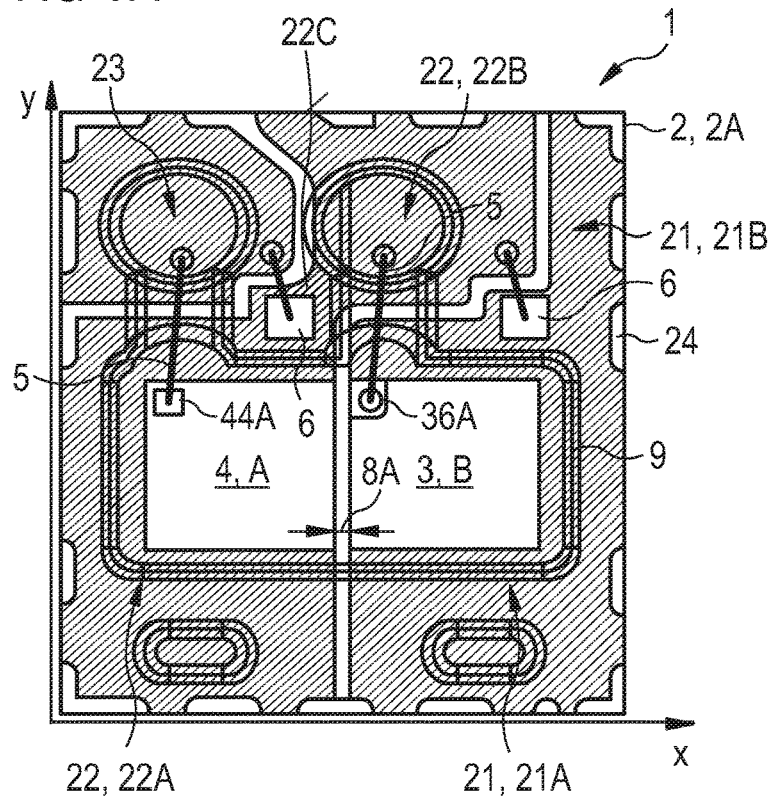
FIG. 1A shows a schematic plan view of a front side of a surface-mountable multi-chip component in accordance with a first exemplary embodiment.
Figure 1B:
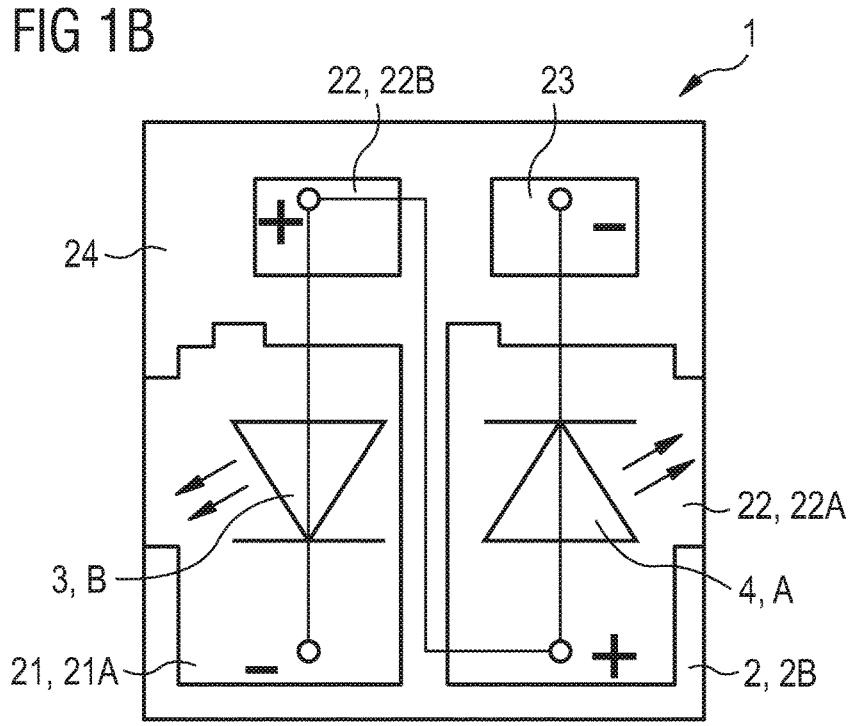
FIG. 1B shows a schematic plan view of a rear side of the surface-mountable multi-chip component in accordance with the first exemplary embodiment.

FIGS. 1A and 1B illustrate a first exemplary embodiment of a surface-mountable multi-chip component 1. The multi-chip component 1 comprises a carrier 2 and also a first semiconductor chip 3 and a second semiconductor chip 4, which are arranged on a front-side main surface 2A of the carrier 2.

The carrier 2 comprises a first connection element 21, a second connection element 22 and a third connection element 23, wherein the first semiconductor chip 3 is arranged on the first connection element 21 and the second semiconductor chip 4 is arranged on the second connection element 22. The connection elements 21, 22, 23 are embodied in an electrically conductive fashion and are electrically insulated from one another. The connection elements 21, 22, 23 have metallic properties, in particular, and can be formed from copper or a copper-containing material, for example. Preferably, the connection elements 21, 22, 23 are produced from the same material and in particular from a single workpiece, for example a so-called leadframe.

The carrier 2 furthermore comprises a main body 24, into which the connection elements 21, 22, 23 are at least partly embedded. In particular, the connection elements 21, 22, 23 are electrically insulated from one another by means of the main body 24. The main body 24 is preferably formed from an electrically insulating basic material such as an epoxy resin, for example. The basic material can contain material additives which influence for example the optical or thermal properties of the main body. By way of example, the basic material can contain carbon black and thus appear black to an observer.

For producing the carrier 2 it is possible to use a leadframe in which the three connection elements 21, 22, 23 are originally connected to one another. The leadframe can be at least partly embedded into the basic material. The leadframe composite assembly thus formed can be divided in such a way that the connection elements 21, 22, 23 are separated from one another and are only still connected to one another by the main body 24.

The carrier 2 is preferably embodied in a plane fashion and extends in a plane spanned by a first main extension direction X and a second main extension direction Y.

The multi-chip component 1 described here is a so-called QFN (Quad Flat No Leads) package. Here the connection elements 21, 22, 23 do not project laterally beyond the main body 24, but rather are integrated into the main body 24 in a plane fashion. As a result, the required space on a connection carrier (not illustrated) on which the multi-chip component 1 can be mounted can be reduced and a higher packing density can be achieved.

The two semiconductor chips 3, 4 are in each case arranged by their rear-side surfaces on the connection elements 21, 22. In particular, the semiconductor chips 3, 4 are fixed to the connection elements 21, 22 by means of a fixing means, for example a solder or an adhesive. Preferably, the semiconductor chips 3, 4 are simultaneously electrically conductively connected by the fixing means to the respective connection element 21, 22 on which they are arranged. Furthermore, the two semiconductor chips 3, 4 are in each case electrically conductively connected to a further connection element 22, 23 by means of an electrical conductor 5. In particular, the first semiconductor chip 3 is electrically conductively connected to the second connection element 22 by means of an electrical conductor 5 and the second semiconductor chip 4 is electrically conductively connected to the third connection element 23 by means of an electrical conductor 5.

During the operation of the surface-mountable multi-chip component 1, the first and third connection elements 21, 23 are at a different potential than the second connection element 22. In particular, the first and third connection elements 21, 23 are at the same potential. The first connection element 21 forms a first electrode and the second connection element 22 forms a second electrode for the first semiconductor chip 3. Furthermore, the third connection element 23 forms a first electrode and the second connection element 22 forms a second electrode for the second semiconductor chip 4.

In the first exemplary embodiment illustrated in FIGS. 1A and 1B, the second connection element 22 forms a common anode for the first and second semiconductor chips 3, 4 during operation. Furthermore, the first connection element 21 forms a cathode for the first semiconductor chip 3. In addition the third connection element 23 forms a cathode for the second semiconductor chip 4.

The semiconductor chips 3, 4 are arranged in different orientations. This means, in particular, that the semiconductor regions of the first and second semiconductor chips 3, 4 which respectively adjoin the connection elements 22, 23 on which the semiconductor chips 3, 4 are arranged have a different conductivity type. By way of example, the semiconductor region of the first semiconductor chip 3 adjoining the first connection element 21 can be p-conducting, while the semiconductor region of the second semiconductor chip 4 adjoining the second connection element 22 is n-conducting.

Figure 3:
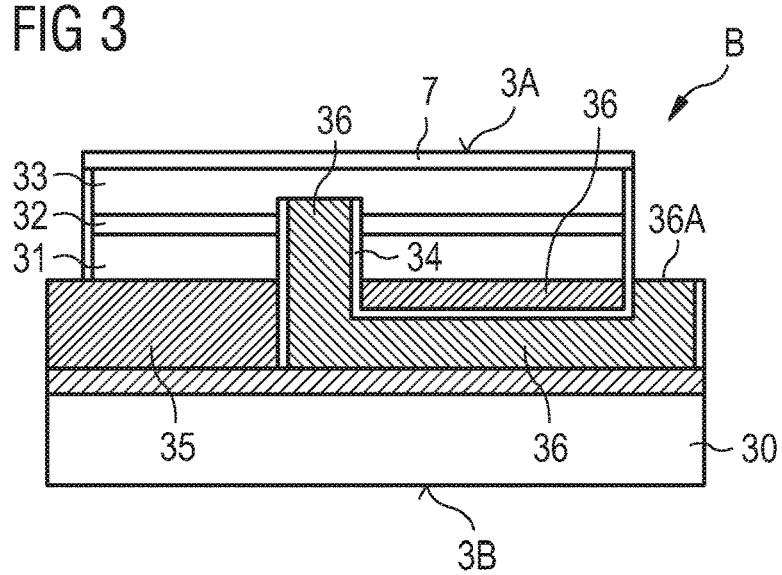
FIG. 3 shows a schematic cross-sectional view of a semiconductor chip in accordance with one exemplary embodiment with arrangement of the p-side near the carrier.

FIG. 3 shows one exemplary embodiment of a semiconductor chip B with arrangement of the p-side near the carrier, which semiconductor chip can be used as first semiconductor chip 3 in the multi-chip component 1 in accordance with the first exemplary embodiment.

Figure 4A:
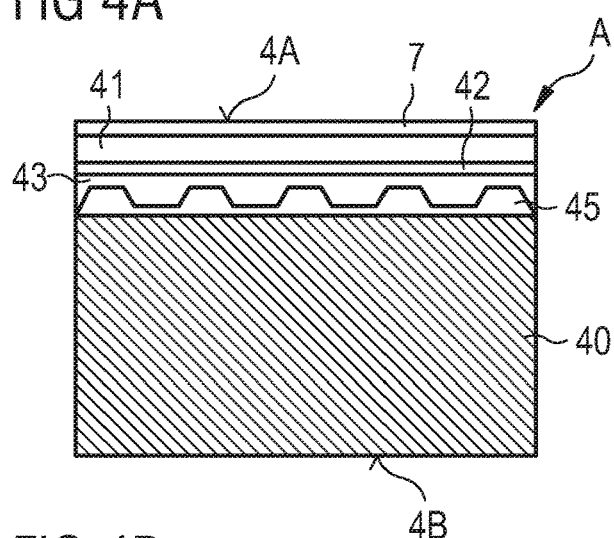
FIG. 4A shows a schematic cross-sectional view and FIG. 4B shows a schematic plan view of a front side of a semiconductor chip in accordance with one exemplary embodiment with arrangement of the n-side near the carrier.
Figure 4B:
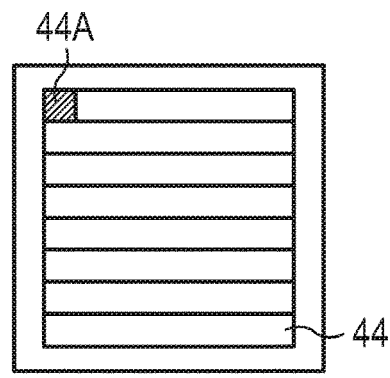

The semiconductor chip B during operation emits in particular radiation having a shorter wavelength than a semiconductor chip A which is used as second semiconductor chip 4 and which is illustrated in FIGS. 4A and 4B. Preferably, the semiconductor chip B emits blue light during operation, while the semiconductor chip A emits red light.

The semiconductor chip B has a semiconductor layer sequence arranged on a carrier substrate 30. In particular, a growth substrate on which the semiconductor layer sequence was originally produced has been removed from the semiconductor layer sequence and replaced by the carrier substrate 30. The semiconductor layer sequence comprises a first semiconductor region 31 of a first conductivity type, an active zone 32 and a second semiconductor region 33 of a second conductivity type, wherein the first semiconductor region 31 is arranged on a side of the active zone 32 facing the carrier substrate 30 and the second semiconductor region 33 is arranged on a side of the active zone 32 facing away from the carrier substrate 30. In particular, the first semiconductor region 31 is p-conducting and the second semiconductor region 33 is n-conducting.

The semiconductor layer sequence is preferably based on a nitride compound semiconductor material. In the present context, "based on a nitride compound semiconductor material" means that the semiconductor layer sequence or at least one layer thereof, in particular the active zone, comprises a nitride III/V compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which substantially do not change the characteristic physical properties of the $Al_nGa_mIn_{1-n-m}N$ material. For the sake of simplicity, however, the above formula includes only the essential constituents of the crystal lattice (Al, Ga, In, N), even if these can be replaced in part by small amounts of further substances.

A first contact layer 35 is arranged between the first semiconductor region 31 and the carrier substrate 30. The first contact layer 35 preferably comprises a material, in particular a metal, having a high reflection coefficient, for instance silver. Furthermore, a second contact layer 36 is arranged between the first semiconductor region 31 and the carrier substrate 30, the second contact layer projecting right into a depression 34 in the active zone 32 and preferably completely filling it.

The carrier substrate 30 can be electrically conductive, such that an operating current is impressed into the semiconductor layer sequence during operation from the rear side, via the carrier substrate 30 and the first contact layer 35 and via a laterally arranged electrical contact location 36A of the second contact layer 36.

The semiconductor chip B can have a radiation-transmissive covering element 7 at its front-side surface 3A. In particular, the covering element 7 has a uniform thickness. Furthermore, the covering element 7 can be a glass element which is adhesively bonded onto a front-side surface of the semiconductor layer sequence.

The semiconductor chip B is provided for emitting electromagnetic radiation generated by the active zone 32 during operation through its front-side surface 3A. Electromagnetic radiation emitted by the active zone 32 in the direction of the rear side, that is to say in the direction of a rear-side surface 3B, is reflected back from the first contact layer 35 and the second contact layer 36 in the direction of the front side.

Advantageously, the electrical contact location 36A is not situated in the beam path of the electromagnetic radiation emitted in the direction of the front side, such that no shading is effected by the electrical contact location 36A.

FIGS. 4A and 4B show one exemplary embodiment of a semiconductor chip A with an arrangement of the n-side near the carrier, which semiconductor chip can be used as second semiconductor chip 4 in the multi-chip component 1 in accordance with the first exemplary embodiment.

The semiconductor chip A has a semiconductor layer sequence arranged on a carrier substrate 40. In particular, a growth substrate on which the semiconductor layer sequence was originally produced has been removed from the semiconductor layer sequence and replaced by the carrier substrate 40. The semiconductor layer sequence comprises a first semiconductor region 41 of a first conductivity type, an active zone 42 and a second semiconductor region 43 of a second conductivity type, wherein the first semiconductor region 41 is arranged on a side of the active zone 42 facing away from the carrier substrate 40 and the second semiconductor region 43 is arranged on a side of the active zone 42 facing the carrier substrate 40. In particular, the first semiconductor region 41 is p-conducting and the second semiconductor region 43 is n-conducting.

The semiconductor layer sequence is preferably based on a phosphide compound semiconductor material. In the present context, "based on a phosphide compound semiconductor material" means that the semiconductor layer sequence, in particular the active zone, preferably comprises $Al_nGa_nIn_{1-n-m}P$, wherein $0≤n≤1$, $0≤m≤1$ and $n+m≤1$, preferably where $n≠0$ and/or $m≠0$. In this case, this material need not necessarily have a mathematically exact composition according to the above formula. Rather, it can comprise one or more dopants and additional constituents which substantially do not change the characteristic physical properties of the material. For the sake of simplicity, however, the above formula includes only the essential constituents of the crystal lattice (Al, Ga, In, P), even if these can be replaced in part by small amounts of further substances.

The semiconductor chip A has on the front side a first contact layer 44 with an electrical contact location 44A, which is arranged in an edge region of the semiconductor layer sequence (cf. FIG. 4B). The contact layer 44 is structured and has interspaces in which the semiconductor layer sequence is not covered by the contact layer 44. Furthermore, the semiconductor chip A can have a radiation-transmissive covering element 7 at its front-side surface 4A. The covering element 7 can be formed from glass. Such a glass element leads to an improvement in the coupling out of radiation in the case of red light and to an attenuation in the case of blue light. In the multi-chip component 1, the ratio of the in any case weaker red portion relative to the blue portion can be improved as a result.

A second contact layer 45 is arranged between the second semiconductor region 43 and the carrier substrate 40. The second contact layer 43 preferably comprises a material, in particular a metal, having a high reflection coefficient, for instance silver.

The semiconductor chip A is provided for emitting electromagnetic radiation generated by the active zone 42 during operation through its front-side surface 4A. Electromagnetic radiation emitted by the active zone 42 in the direction of the rear side, that is to say in the direction of a rear-side surface 4B, is reflected back from the second contact layer 45 in the direction of the front side.

Advantageously, the first contact layer 44 has interspaces through which radiation can be emitted. Furthermore, the electrical contact location 44A is not situated at a central location in the beam path of the electromagnetic radiation emitted in the direction of the front side, such that no shading is effected by the electrical contact location 44A.

In the first exemplary embodiment illustrated in FIGS. 1A and 1B, the contact location 36A of the first semiconductor chip 3 is electrically connected to the second connection element 22 by means of the electrical conductor 5, in particular a bonding wire. Furthermore, the contact location 44A of the second semiconductor chip 1 is electrically connected to the second connection element 22 by means of the electrical conductor 5, in particular a bonding wire.

The second connection element 22 comprises a first partial region 22A and a second partial region 22B. The two partial regions 22A, 22B are connected to one another by a central region 22C of the second connection element 22. The second connection element 22 extends substantially along a diagonal connecting the two corners of the carrier 2 to one another. The second semiconductor chip 4 is arranged on the first partial region 22A. The second partial region 22B serves as a connection region for the first semiconductor chip 3, wherein the electrical conductor 5 is fixed to the second partial region 22B. A protective diode 6 is arranged on the central region 2C, and protects the second semiconductor chip 4 against overvoltages.

The first connection element 21 also comprises a first partial region 21A and a second partial region 21B. The first semiconductor chip 3 is arranged on the first partial region 21A. Furthermore, a protective diode 6 is arranged on the first partial region 21A, and protects the first semiconductor chip 3 against overvoltages.

The carrier 2 is composed of the connection elements 21, 22, 23 in such a way that the first partial region 21A of the first connection element 21 and the first partial region 22A of the second connection element 22 are arranged alongside one another along the first main extension direction X of the carrier 2. Furthermore, the second partial region 21B of the first connection element 21 and the second partial region 22B of the second connection element 22 are also arranged alongside one another along the first main extension direction X of the carrier 2.

Furthermore, the carrier 2 is composed of the connection elements 21, 22, 23 in such a way that the third connection element 23 and the second partial region 22B of the second connection element 22 are arranged alongside one another along the first main extension direction X of the carrier 2. Furthermore, the third connection element 23 and the first partial region 22A of the second connection element 22 are arranged alongside one another along the second main extension direction Y of the carrier 2.

The two semiconductor chips 3, 4 are arranged alongside one another along the first main extension direction X. Advantageously, the carrier 2 described here allows relatively small distances between the semiconductor chips 3, 4, such that the multi-chip component 1 has a compact size. In particular, the first and second semiconductor chips 3, 4 are separated from one another by an interspace 8 having a lateral dimension 8A of greater than zero and at most 0.1 mm. Overall the multi-chip component 1 advantageously has small dimensions which are just 3.1 mm×3.75 mm with a height of 0.5 mm.

The multi-chip component 1 comprises a housing frame 9 arranged on the carrier 2. The semiconductor chips 3, 4 are arranged within the housing frame 9. In particular, the housing frame 9 is embodied in a reflective fashion. By way of example, the housing frame 9 can be formed from a plastics material such as silicone, to which reflective particles, for example particles of titanium dioxide, are added. The semiconductor chips 3, 4 can furthermore be embedded into a potting that is laterally delimited by the housing frame.

FIG. 1B illustrates a rear-side main surface 2B of the carrier 2 or of the surface-mountable multi-chip component 1. As is evident from FIG. 1B, the second connection element 22 is partly covered by the main body 24 at the rear-side main surface 2B. In particular, the central region 22C of the second connection element 22 is covered by the main body 24. Furthermore, the second partial region 21B of the first connection element 21 can be covered by the main body 24. As a result, the multi-chip component 1 has on the rear side of the carrier 2 four connection regions, namely the first partial region 21A of the first connection element 21, the first and second partial regions 22A, 22B of the second connection element 22 and the third connection element 23, such that the multi-chip component can be mechanically and electrically connected to a connection carrier (not illustrated) at four locations. The four connection regions are arranged symmetrically. As a result of the symmetrical arrangement of the four connection regions, the multi-chip component 1 can be fixed mechanically stably on a connection carrier.

Figure 2A:
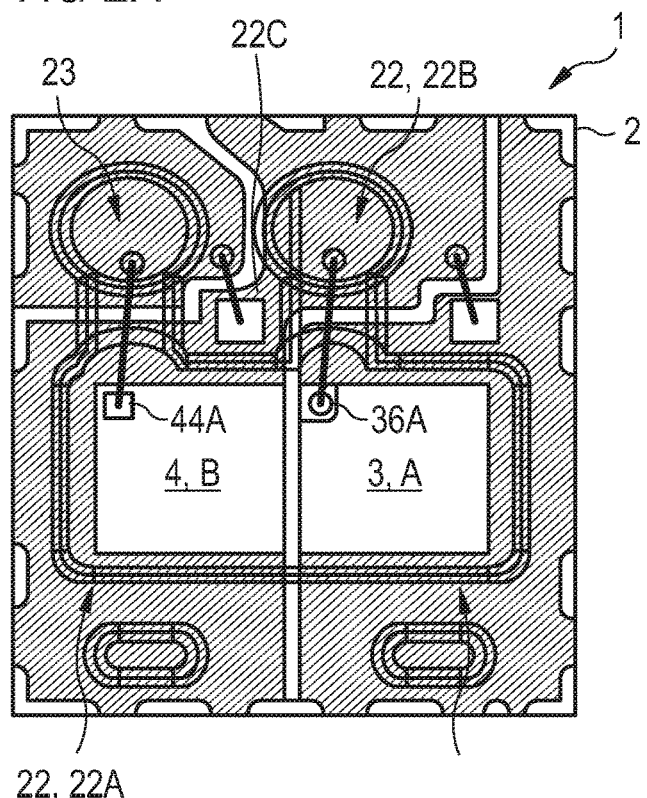
FIG. 2A shows a schematic plan view of a front side of a surface-mountable multi-chip component in accordance with a second exemplary embodiment.
Figure 2B:
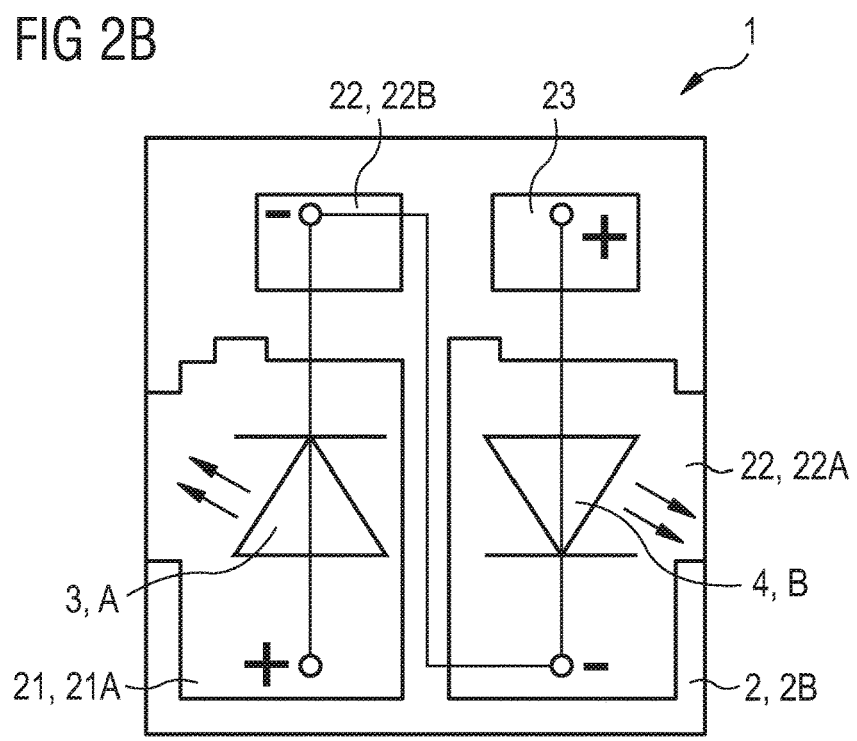
FIG. 2B shows a schematic plan view of a rear side of the surface-mountable multi-chip component in accordance with the second exemplary embodiment.

The multi-chip component 1 in accordance with a second exemplary embodiment as illustrated in FIGS. 2A and 2B has a carrier 2, which is preferably embodied identically to the carrier described in association with the first exemplary embodiment. Furthermore, as in the first exemplary embodiment, the first and second semiconductor chips 3, 4 are arranged on two different connection elements 21, 22 and are connected to a further connection element 22, 23 by means of an electrical conductor. However, in the second exemplary embodiment, the semiconductor region of the first semiconductor chip 3 adjoining the first connection element 21 is n-conducting, while the semiconductor region of the second semiconductor chip 4 adjoining the second connection element 22 is p-conducting. Preferably, the first semiconductor chip 3 is embodied like the semiconductor chip A illustrated in FIGS. 4A and 4B, while the second semiconductor chip 4 is embodied like the semiconductor chip B illustrated in FIG. 3.

In the second exemplary embodiment, the second connection element 22 forms a cathode for the first and second semiconductor chips 3, 4 during operation. Furthermore, the first connection element 21 forms an anode for the first semiconductor chip 3. In addition the third connection element 23 forms an anode for the second semiconductor chip 4.

Advantageously, both in the first exemplary embodiment and in the second exemplary embodiment of a surface-mountable multi-chip component 1, the first and second semiconductor chips 3, 4 are drivable separately from one another.

Such a multi-chip component 1 is particularly suitable for projection and spotlight/headlight applications.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A multi-chip component comprising:
a carrier having a main body, a first connection element, a second connection element and a third connection element, the first, second and third connection elements being at least partially embedded in the main body and being electrically insulated from one another;
a first semiconductor chip arranged on the first connection element and electrically connected to the first and second connection elements, wherein the first connection element forms a first electrode and the second connection element forms a second electrode for the first semiconductor chip; and
a second semiconductor chip arranged on the second connection element and electrically connected to the second and third connection elements, wherein the third connection element forms a first electrode and the second connection element forms a second electrode for the second semiconductor chip, wherein the second connection element forms a common cathode or anode for the first and second semiconductor chips during operation,
wherein the second connection element has a first and second partial region, the two partial regions being connected to one another by a central region of the second connection element, and the central region being covered by the main body at a rear-side main surface of the carrier such that the multi-chip component has four connection regions on the rear side of the carrier, and
wherein the multi-chip component is a surface-mountable chip component.

2. The multi-chip component according to claim 1, wherein the first connection element has a first partial region,
wherein the second semiconductor chip is arranged on the first partial region of the second connection element,
wherein the first partial region of the first connection element and the first partial region of the second connection element are arranged alongside one another along a first main extension direction of the carrier,
wherein the third connection element and the second partial region of the second connection element are arranged alongside one another along the first main extension direction, and
wherein the third connection element and the first partial region of the second connection element are arranged alongside one another along a second main extension direction, which runs transversely with respect to the first main extension direction, of the carrier.

3. The multi-chip component according to claim 1, wherein the first and second semiconductor chips each have a first semiconductor region of a first conductivity type and a second semiconductor region of a second conductivity type, and wherein semiconductor regions of the same conductivity type of the first and second semiconductor chips are electrically connected to one another by the second connection element.

4. The multi-chip component according to claim 3, wherein semiconductor regions of the first and second semiconductor chips that adjoin the connection elements are of different conductivity types.

5. The multi-chip component according to claim 1, wherein a first partial region of the first connection element and the first partial region of the second connection element are arranged alongside one another along a first main extension direction of the carrier.

6. The multi-chip component according to claim 1, wherein the third connection element and the second partial region of the second connection element are arranged alongside one another along a first main extension direction of the carrier.

7. The multi-chip component according to claim 1, wherein the third connection element and the first partial region of the second connection element are arranged alongside one another along a second main extension direction of the carrier.

8. The multi-chip component according to claim 1, wherein no semiconductor chip is arranged on the third connection element.

9. The multi-chip component according to claim 1, wherein the first semiconductor chip is electrically connected to the second connection element by an electrical conductor.

10. The multi-chip component according to claim 9, wherein the second semiconductor chip is electrically connected to the third connection element by an electrical conductor.

11. The multi-chip component according to claim 1, wherein the carrier further comprises a main body, and wherein the first, second and third connection elements are at least partly embedded in the main body.

12. The multi-chip component according to claim 11, wherein the second connection element is partly covered by the main body at a rear-side main surface of the carrier.

13. The multi-chip component according to claim 1, wherein the first and second semiconductor chips are separated from one another by an interspace having a lateral dimension of greater than zero and at most 0.1 mm.

14. The multi-chip component according to claim 1, wherein the first and second semiconductor chips each have a radiation-transmissive covering element arranged at a front-side surface of the first and second semiconductor chips facing away from the respective connection element.

15. The multi-chip component according to claim 1, further comprising a housing frame, wherein the first and second semiconductor chips are arranged within the housing frame.

16. The multi-chip component according to claim 1, wherein the first and second semiconductor chips emit radiation in different wavelength ranges during operation.

17. The multi-chip component according to claim 1, wherein the separate first and third electrodes semiconductor chips are separately drivable from one another by means of the common cathode or anode.

* * * * *